(12) United States Patent
Lim et al.

(10) Patent No.: US 7,399,702 B2
(45) Date of Patent: Jul. 15, 2008

(54) METHODS OF FORMING SILICIDE

(75) Inventors: Chan Lim, Curpertino, CA (US); Bum Ki Moon, LaGrangeville, NY (US)

(73) Assignee: Infineon Technologies AG, Munich (DE)

( * ) Notice: Subject to any disclaimer, the term of this patent is extended or adjusted under 35 U.S.C. 154(b) by 409 days.

(21) Appl. No.: 11/048,236

(22) Filed: Feb. 1, 2005

(65) Prior Publication Data
US 2006/0172503 A1    Aug. 3, 2006

(51) Int. Cl.
*H01L 21/44* (2006.01)
(52) U.S. Cl. .............. 438/655; 438/682; 438/683; 257/755; 257/768; 257/E21.165
(58) Field of Classification Search ............. 438/655; 257/E21.165
See application file for complete search history.

(56) References Cited

U.S. PATENT DOCUMENTS

| | | | |
|---|---|---|---|
| 5,047,367 A | 9/1991 | Wei et al. | |
| 5,384,285 A * | 1/1995 | Sitaram et al. | 438/664 |
| 5,780,362 A | 7/1998 | Wang et al. | |
| 5,902,129 A | 5/1999 | Yoshikawa et al. | |
| 5,953,612 A | 9/1999 | Lin et al. | |
| 5,970,370 A | 10/1999 | Besser et al. | |
| 6,091,152 A | 7/2000 | Iwata | |
| 6,121,139 A | 9/2000 | Chang et al. | |
| 6,150,249 A | 11/2000 | Lee et al. | |
| 6,274,511 B1 | 8/2001 | Wieczorek et al. | |
| 6,281,102 B1 | 8/2001 | Cao et al. | |
| 6,399,467 B1 | 6/2002 | Erhardt et al. | |
| 6,410,429 B1 | 6/2002 | Ho et al. | |
| 6,562,718 B1 | 5/2003 | Xiang et al. | |
| 6,653,227 B1 | 11/2003 | Lai et al. | |
| 6,673,665 B2 | 1/2004 | Wieczorek et al. | |
| 6,689,673 B1 | 2/2004 | Hsu et al. | |
| 6,716,745 B2 | 4/2004 | Akram et al. | |
| 6,767,812 B2 | 7/2004 | Abe et al. | |
| 6,767,831 B1 | 7/2004 | Chu et al. | |
| 6,787,464 B1 | 9/2004 | Cheek et al. | |
| 2001/0045651 A1 * | 11/2001 | Saito et al. | 257/750 |

(Continued)

FOREIGN PATENT DOCUMENTS

JP    2001156287 A  *  6/2001

OTHER PUBLICATIONS

Mayer, J.W., et al., "Electronic Materials Science: For Integrated Circuits in Si and GaAs," 1990, p. 313, Macmillan Publishing Co., NY, US.
Wen, H. C., et al., "Effect on Ni Thickness Dependance on NISI FUSI Metal Gate Characteristics," Electrochemical and Solid-State Letters, vol. 7, Issue (11), pp. G258 and G260 (2004).

*Primary Examiner*—Tu-Tu V Ho
(74) *Attorney, Agent, or Firm*—Slater & Matsil, L.L.P.

(57) ABSTRACT

Methods of fully siliciding semiconductive materials of semiconductor devices are disclosed. A preferred embodiment comprises depositing an alloy comprised of a first metal and a second metal over a semiconductive material. The device is heated, causing atoms of the semiconductive material to move towards and bond to the atoms of the second metal, leaving vacancies in the semiconductive material, and causing atoms of the first metal to move into the vacancies in the semiconductive material.

33 Claims, 6 Drawing Sheets

U.S. PATENT DOCUMENTS

| | | |
|---|---|---|
| 2002/0111018 A1 | 8/2002 | Tai |
| 2002/0182836 A1 | 12/2002 | Agnello et al. |
| 2004/0097060 A1 | 5/2004 | San et al. |
| 2004/0123922 A1 | 7/2004 | Cabral, Jr. et al. |
| 2004/0132268 A1* | 7/2004 | Koo et al. .................. 438/583 |
| 2005/0253204 A1* | 11/2005 | Chan et al. .................. 257/412 |

* cited by examiner

METHODS OF FORMING SILICIDE

TECHNICAL FIELD

The present invention relates generally to the manufacturing of semiconductor devices, and more particularly to methods of forming silicide materials.

BACKGROUND

Generally, semiconductor devices are used in a variety of electronic applications, such as personal computers, cell phones, digital cameras, and other electronic equipment, as examples. Semiconductor devices are typically fabricated by sequentially depositing insulating or dielectric layers, conductive layers, and semiconductive layers of material over a semiconductor substrate, and patterning the various layers using lithography to form circuit components and elements thereon. In the very large scale integration (VLSI) era, metal oxide semiconductor (MOS) devices are continuously being designed smaller and smaller, and have requirements of high performance and low power consumption.

In semiconductor device manufacturing, silicides or silicide materials, which are alloys of silicon and metals, are often used. Silicides are typically formed by the reaction of a metal with silicon, and they are used in a variety of applications. For example, in transistors, silicide may be used at the source, drain and/or gate regions, or it may be used to construct gates or local interconnect lines, as examples.

Silicide materials are commonly used in advanced complimentary metal oxide semiconductor (CMOS) technology. Silicides reduce sheet resistance and contact resistance, which is particularly advantageous when a silicide is disposed over the source, drain, and gate region of a transistor, as examples, although silicides are also used in other applications.

A silicide is typically formed by depositing a metal layer such as Co or Ni over a silicon layer, and then annealing the semiconductor structure. Where the metal layer is in contact with the silicon, a silicide is formed. The un-reacted metal is then etched away. In some applications, the silicide formed is automatically aligned to the underlying polysilicon layer; thus, it is often referred to as a Self-ALigned silicide or a "salicide."

One disadvantage of prior art methods of forming silicide materials is the phenomenon of incomplete silicidation, as shown at 128 in prior art FIG. 5, which will be described further herein. If incomplete silicidation 128 occurs in the gates of a semiconductor device 100 or integrated circuit having a plurality of transistors, for example, this is a problem, because the transistors of the device 100 have different operating characteristics. For example, transistors having gates that are fully silicided have less resistance and thinner electrical gate dielectric thickness due to no depletion of silicide gates than transistors having incompletely silicided gates, and thus, the transistors having fully silicided gates operate faster. Thus, incomplete silicidation results in decreased device performance and decreased yields.

What are needed in the art are improved methods of forming silicide materials.

SUMMARY OF THE INVENTION

These and other problems are generally solved or circumvented, and technical advantages are generally achieved, by preferred embodiments of the present invention, which provide novel methods of forming silicide materials. A metal alloy comprising a first metal and a second metal is deposited over the semiconductive material to be silicided. The first metal comprises a dominant diffusion species metal and the second metal comprises a heavy metal that is not a dominant diffusion species. The device is heated, causing at least a portion of the atoms of the first metal to migrate towards and bond with atoms of the semiconductive material. Heating the device also causes a portion of the atoms of the semiconductive material to move towards and bond with atoms of the second metal of the metal alloy, leaving behind vacancies in the semiconductive material, which is beneficial because movement of the atoms of the first metal is facilitated: a portion of the atoms of the first metal fills the vacancies in the semiconductive material.

In accordance with a preferred embodiment of the present invention, a method of manufacturing a semiconductor device includes providing a workpiece, the workpiece comprising a semiconductive material disposed at a top surface thereof, and depositing a first material layer over at least the semiconductive material, the first material layer comprising an alloy of a first metal and a second metal, wherein the first metal comprises a plurality of first atoms, the second metal comprises a plurality of second atoms, and the semiconductive material comprises a plurality of third atoms. A second material layer is deposited over the first material layer, the second material layer comprising an oxide-formation preventing material, and the workpiece is heated, causing a portion of the third atoms of the semiconductive material to move towards and bond to the second atoms of the second metal, leaving vacancies in the semiconductive material, and causing a portion of the first atoms of the first metal to move into the vacancies in the semiconductive material.

In accordance with another preferred embodiment of the present invention, a method of manufacturing a transistor includes providing a workpiece, depositing a gate dielectric material over the workpiece, and depositing a gate material over the gate dielectric material, the gate material comprising a semiconductive material. The method includes patterning the gate material and the gate dielectric material, forming a gate and a gate dielectric; forming source and drain regions in the workpiece proximate the gate and gate dielectric; and depositing an insulating layer over the source and drain regions and the patterned gate material and gate dielectric material. The insulating layer is removed, exposing a top surface of the patterned gate material, and a first material layer is deposited over at least the semiconductive material, the first material layer comprising an alloy of a first metal and a second metal, wherein the first metal comprises a plurality of first atoms. The second metal comprises a plurality of second atoms, and the semiconductive material of the gate comprises a plurality of third atoms. The method includes depositing a second material layer over the first material layer, the second material layer comprising an oxide-formation preventing material, and heating the workpiece, causing a portion of the third atoms of the semiconductive material of the gate to move towards and bond with a portion of the second atoms of the second metal, leaving vacancies in the semiconductive material, and causing a portion of the first atoms of the first metal to move into the vacancies in the semiconductive material of the gate. The first material layer and the second material layer are removed from over the semiconductive material.

In accordance with another preferred embodiment of the present invention, a method of manufacturing a semiconductor device includes providing a workpiece, the workpiece comprising a semiconductive material disposed at a top surface thereof, the semiconductive material comprising a first thickness. A first metal layer is deposited over the semiconductive material, the first metal layer comprising a plurality of first atoms, the first metal layer comprising a second thickness, the second thickness being less than the first thickness. A second metal layer is deposited over the first metal layer, the second metal layer comprising a plurality of second atoms, wherein the semiconductive material comprises a plurality of third atoms. The method includes depositing an oxide-formation preventing material over the second metal layer, and heating the workpiece, causing a portion of the third atoms of the semiconductive material to move through the first metal layer and towards the second atoms of the second metal layer, bonding with the atoms of the second metal layer and leaving vacancies in the semiconductive material, and causing a portion of the first atoms of the first metal layer to move into the vacancies in the semiconductive material.

Advantages of preferred embodiments of the present invention include providing novel methods of forming silicide materials that form a fully silicided material. Embodiments of the invention are particularly useful in the silicidation of high aspect ratio features. The resistance of conductive features, such as gates, is reduced. In transistor applications, forming fully silicided gates in accordance with embodiments of the present invention results in reduced poly depletion and Fermi-pinning effects. The materials, material thicknesses, and temperatures are selected to achieve a differential diffusion rate of silicon (Si) and the siliciding metal (Co or Ni), resulting in a directional material exchange that fully silicides a Si layer.

The foregoing has outlined rather broadly the features and technical advantages of embodiments of the present invention in order that the detailed description of the invention that follows may be better understood. Additional features and advantages of embodiments of the invention will be described hereinafter, which form the subject of the claims of the invention. It should be appreciated by those skilled in the art that the conception and specific embodiments disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the preferred embodiments and are not necessarily drawn to scale.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, namely, with respect to forming silicide materials in transistor structures. Embodiments of the invention may also be applied, however, to other semiconductor applications and technologies where silicides are formed.

Figure 1:
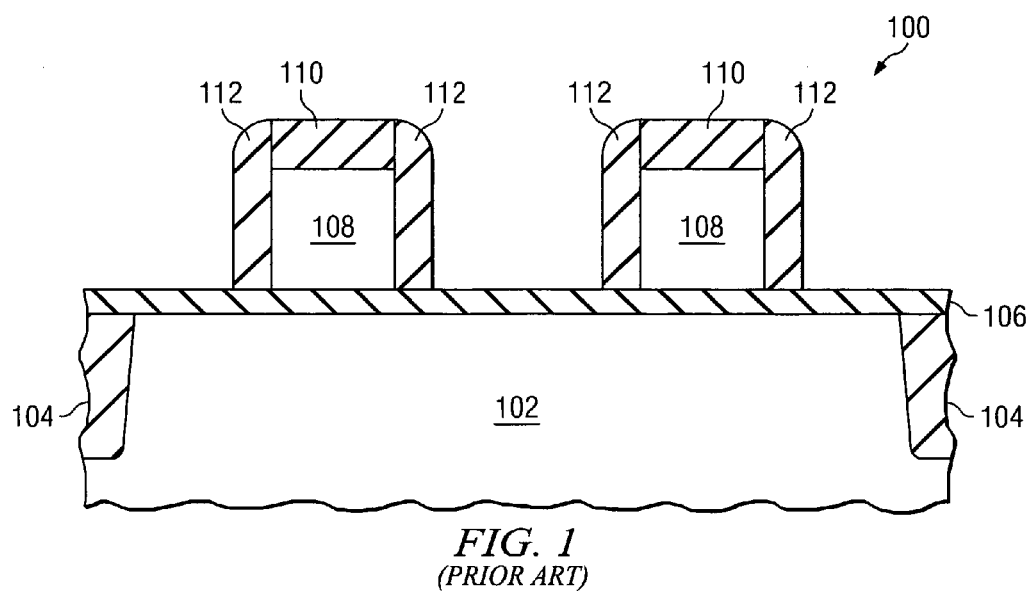
FIGS. 1 through 5 show cross-sectional views a prior art integration scheme at various stages of manufacturing of a CMOS transistor, illustrating the partial silicidation problem of prior art methods of forming silicide in FIG. 5.
Figure 3:
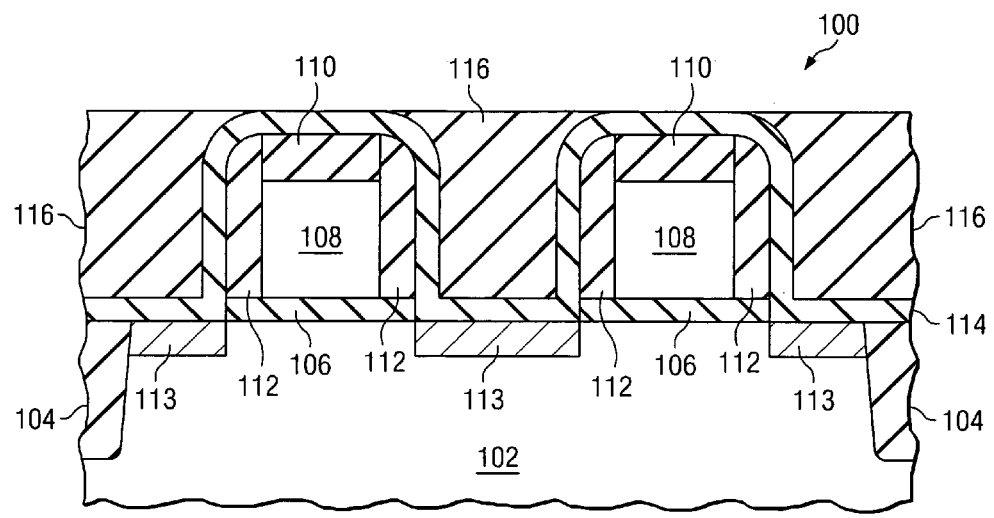
Figure 4:
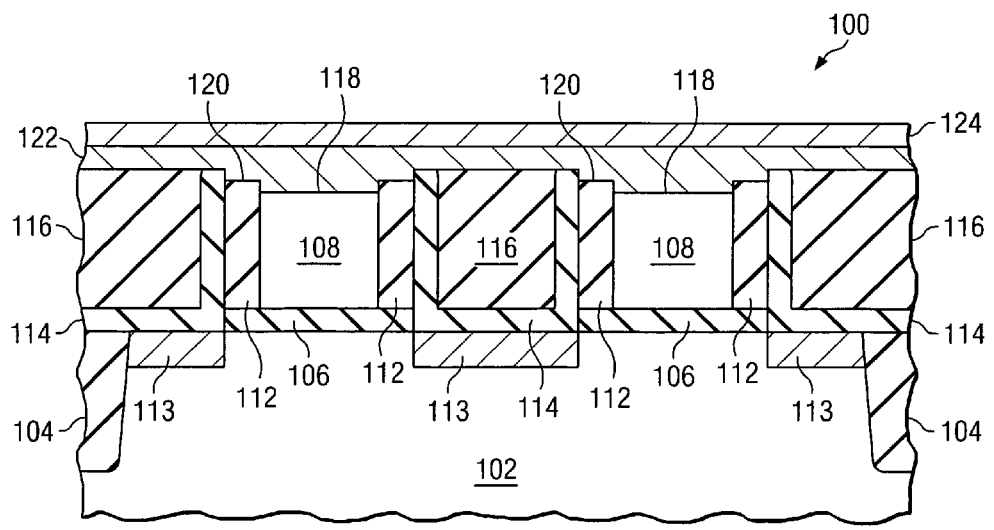
Figure 5:
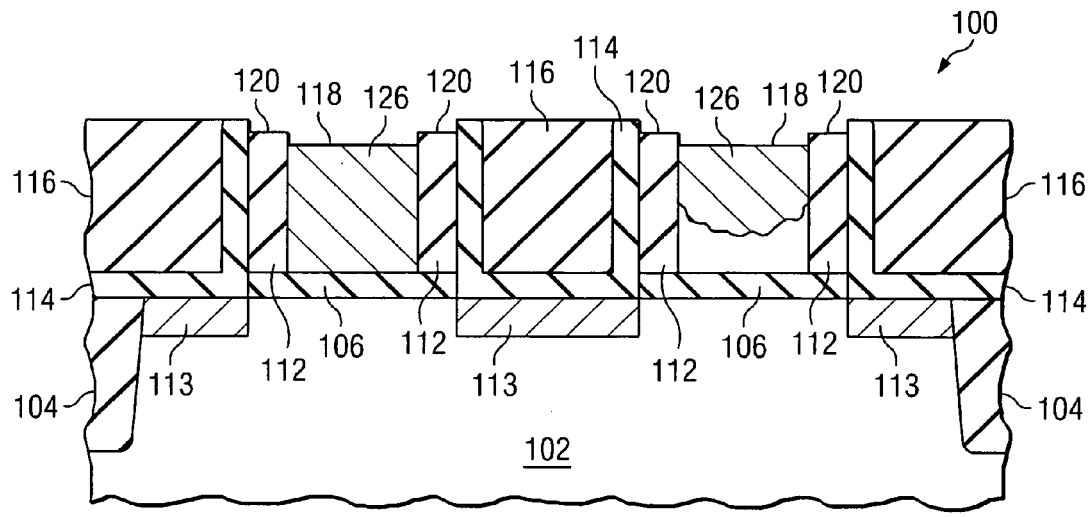

With reference now to FIGS. 1 through 5, cross-sectional views of a prior art integration scheme for manufacturing a CMOS transistor at various stages of manufacturing are shown, illustrating the partial silicidation problem of prior art methods of forming silicide, e.g., at 128 in FIG. 5. Referring first to FIG. 1, to fabricate the semiconductor device 100, first, a workpiece 102 is provided. The workpiece 102 may include a semiconductor substrate comprising silicon or other semiconductor materials covered by an insulating layer, for example. The workpiece 102 may also include other active components or circuits, not shown. The workpiece 102 may comprise silicon oxide over single-crystal silicon, for example. The workpiece 102 may include other conductive layers or other semiconductor elements, e.g., transistors, diodes, etc. Compound semiconductors, GaAs, InP, Si/Ge, or SiC, as examples, may be used in place of silicon. The workpiece 102 may also comprise a silicon-on-insulator (SOI) substrate.

Shallow trench isolation (STI) regions 104 may be formed in a top portion of the workpiece 102, as shown. The STI regions 104 may comprise an insulator such as an oxide or nitride, as examples. A gate dielectric material 106 is formed over the top surface of the workpiece 102. The gate dielectric material 106 may comprise an insulator such as an oxide, a nitride, or an oxynitride, as examples. The gate dielectric material 106 may also comprise high dielectric constant (k) materials, for example.

A semiconductive material 108 is formed over the gate dielectric material 106. The semiconductive material 108 may comprise polysilicon or other semiconductors. The semiconductive material 108 will form the gate of the transistor, and is the material that will be silicided. A cap layer 110 is formed over the semiconductive material 108, as shown. The cap layer 110 typically comprises a nitride material such as silicon nitride, although alternatively, the cap layer 110 may comprise another insulating material, for example.

The cap layer 110 and the semiconductive material 108 are patterned and etched using lithography, to form the cap layer 110 and the semiconductive material 108 into the shape of the gate of a transistor, as shown in FIG. 1. Spacers 112 are formed on the sidewalls of the semiconductive material 108 and the cap layer 110, as shown. The spacers 112 may comprise an oxide, a nitride, or both, for example. For example, the spacers 112 may comprise a first layer of oxide and a second layer of nitride disposed over the oxide (not shown).

Figure 2:
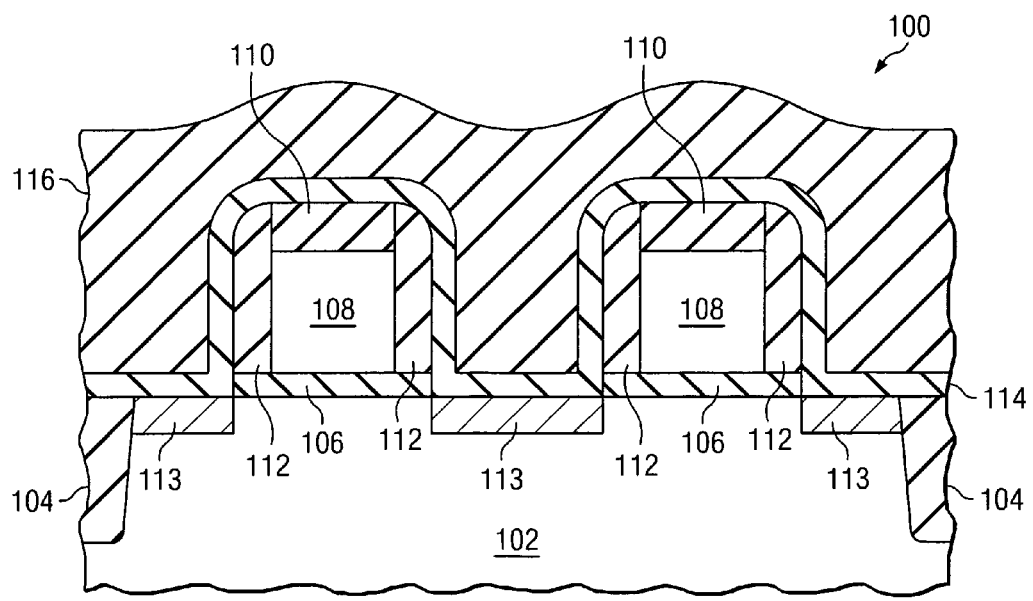

The gate dielectric material 106 is patterned by etching exposed portions of the gate dielectric material 106. For example, the gate dielectric material 106 remains residing beneath the semiconductive material 108 and the spacers 112, as shown in FIG. 2. A silicide 113 may be formed at the top surface of the source and drain regions of the transistor, also shown in FIG. 2. Only two transistors are shown in the semiconductor device 100 shown; however, there may be a plurality of transistors formed during the processing steps described herein. Two adjacent transistors may comprise a complimentary MOS (CMOS) device, that uses both positive and negative channel devices in complimentary configurations, for example.

Next, a thin insulating layer 114 is deposited over the entire structure. The thin insulating layer 114 may comprise a nitride material, for example. Then, a thick insulating layer 116 is deposited over the thin insulating layer 114, as shown. The thick insulating layer 116 may comprise an oxide such as $SiO_2$, for example, although other insulating materials may be used. In some applications, the thin insulating layer 114 and thick insulating layer 116 may comprise a single layer of material, for example.

The insulating layers 116 and 114 and the cap layer 110 are removed to expose the top surface of the semiconductive material 108 so that the semiconductive material 108 may be silicided. For example, the top surface of the thick insulating layer 116 may be planarized using a chemical mechanical polish (CMP) process, stopping on the thin insulating layer 114, as shown in FIG. 3. The thin insulating layer 114 may function as an etch stop layer, for example.

An isotropic etch process that etches nitride more readily than oxide may be used to remove the exposed thin insulating layer 114 and cap layer 110. A portion of the thick insulating layer 116 and the spacers 112 (e.g., at 120) may be removed during the etch process to expose the top surface 118 of the semiconductive material 108, for example.

To form a silicided gate from the semiconductive material 108, a layer of metal 122 such as Co or Ni is deposited over the exposed semiconductive material 108, as shown in FIG. 4. An oxide-formation preventing layer 124 comprising TiN, for example, is typically deposited over the layer of metal 122 as shown. The workpiece 102 is heated, causing a portion of the Co or Ni of the layer of metal 122 to move into the semiconductive material 108 and form a silicide material 126, as shown in FIG. 5. The unreacted layer of metal 122 and the oxide-formation preventing layer 124 are then removed, leaving the semiconductor device 100 shown in FIG. 5.

A problem with the prior art method of forming silicide 126 is that for transistor gates that are small and deep, the semiconductive material 108 may not fully silicide. Rather, a bottom portion of the semiconductive material 108 remains unsilicided, e.g., at 128. Some transistors may have fully silicided gates, e.g., as in the left of FIG. 5, and others may have incompletely silicided gates, e.g., as shown in the right of FIG. 5. Incomplete silicidation 128 results in increased resistance, which slows device 100 performance. Furthermore, not all of the transistors formed have the same performance characteristics, resulting in uncertainty in the semiconductor device 100 design. Incomplete silicidation 128 results in decreased device performance and decreased yields.

Volume expansion occurs during silicidation, and if a silicon-filled structure is very narrow, deep, and tightly confined, such as in the transistor gate 108 structure shown in FIGS. 1 through 5, silicidation cannot occur completely enough the consume all of the silicon of the gate 108, resulting in a partially silicided structure. In particular, in high aspect ratio features, there may not be enough room to accommodate high volume silicide (e.g., Ni-silicide or Co-silicide) in the narrow polysilicon-filled structure.

Figure 6:
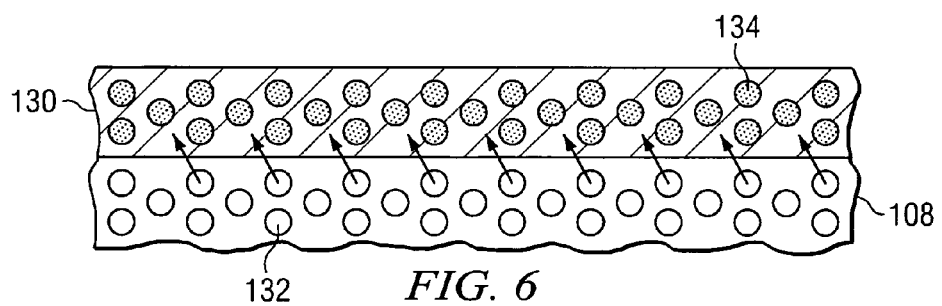
FIG. 6 is a prior art cross-sectional view of a titanium (Ti) layer formed over a silicon (Si) layer, wherein the Si atoms move into the Ti layer when the structure is heated.

FIG. 6 is a prior art cross-sectional view of a titanium (Ti) layer 130 formed over a silicon (Si) layer 108. Ti is a "heavy" metal and Ti atoms 134 do not move easily. Thus, when the structure 130/108 is heated, a portion of the Si atoms 132 migrate or diffuse into the Ti layer 130 to bond with the Ti atoms 134, as shown. The Si atoms 132 comprise the moving species in these two adjacent material layers 108 and 130.

Figure 7:
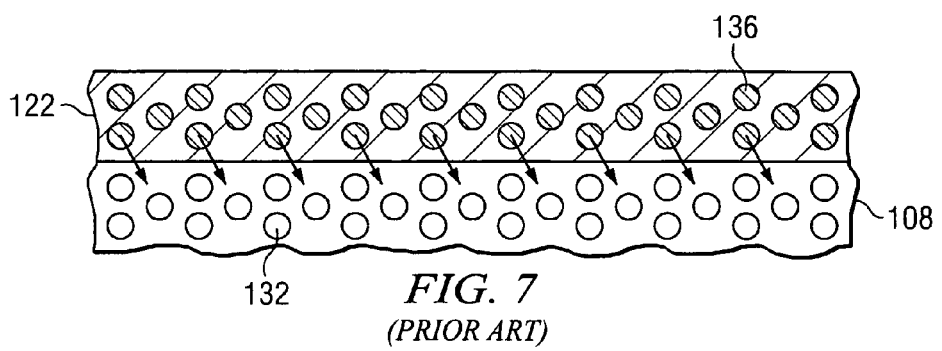
FIG. 7 is a prior art cross-sectional view of a nickel (Ni) or cobalt (Co) layer formed over a silicon (Si) layer, wherein the Ni or Co atoms move into the Si layer when the structure is heated.

However, other metals, such as Ni and Co, are dominant diffusion species and tend to move into an adjacent Si layer 108 when it is heated, as shown in FIG. 7. A prior art cross-sectional view of a nickel (Ni) or cobalt (Co) layer 122 formed over a silicon (Si) layer 108 is shown, wherein the Ni or Co atoms 136 move into the Si layer 108 to bond with the Si atoms 132 when the structure 122/108 is heated.

Embodiments of the present invention achieve technical advantages by providing silicidation schemes that are designed to take advantage of and utilize dominant diffusion species and non-dominant diffusion species to ensure that vacancies exist for the silicidation process to occur at, thus ensuring that a semiconductive material is fully silicided, even for high aspect ratio features. In particular, optimal materials, material thicknesses, and heating temperatures are chosen to achieve a fully silicided material, to be described further herein.

For FIGS. 9 through 15, like numerals are used for the various elements that were described in FIGS. 1 through 7, where possible. To avoid repetition, each reference number shown in FIGS. 1 through 7 is not described again in detail herein. Rather, similar materials x02, x04, x06, x08, etc. are preferably used for the various material layers shown as were described for FIGS. 1 through 7, where x=1 in FIGS. 1 through 7, x=2 in FIGS. 8 through 10, 14 and 15, and x=3 in FIGS. 11 through 13. As an example, the preferred and alternative materials and dimensions described for the workpiece 102 in the description for FIGS. 1 through 7 are preferably also used for the workpiece 202 of FIGS. 8 through 10, 14 and 15.

Figure 8:
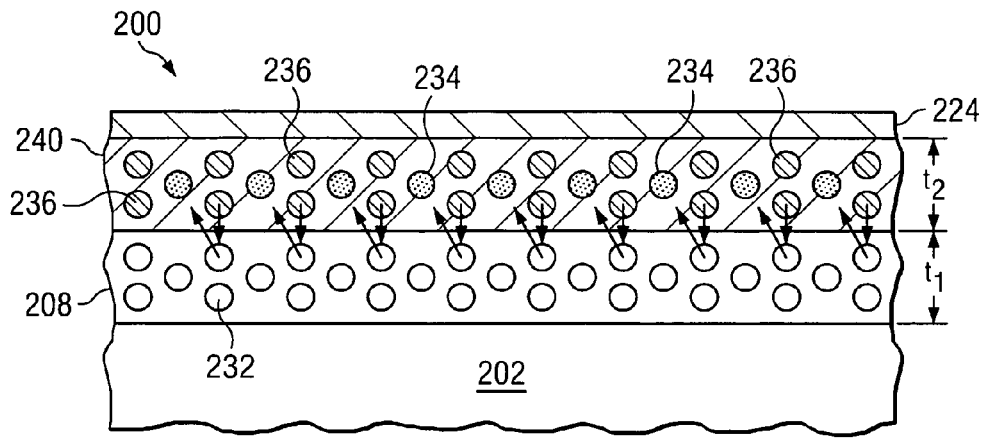
FIGS. 8 through 10 show cross-sectional views of a method of forming silicide in accordance with a preferred embodiment of the present invention.
Figure 9:
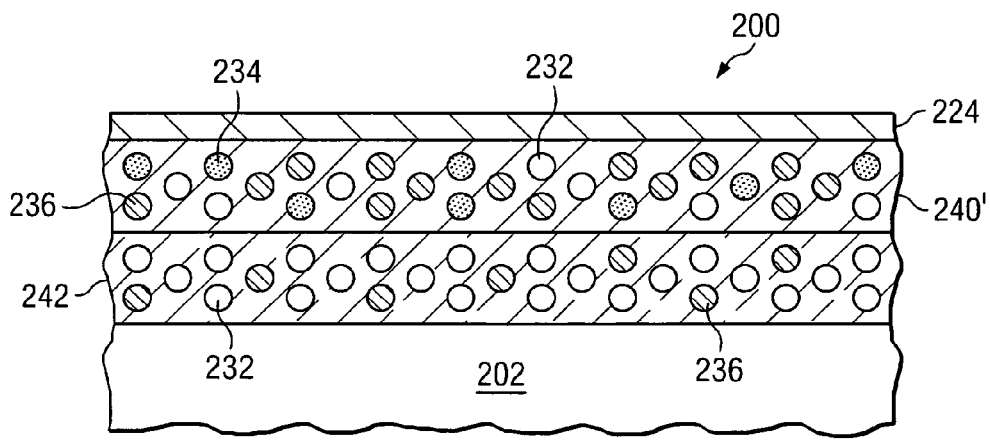
Figure 10:
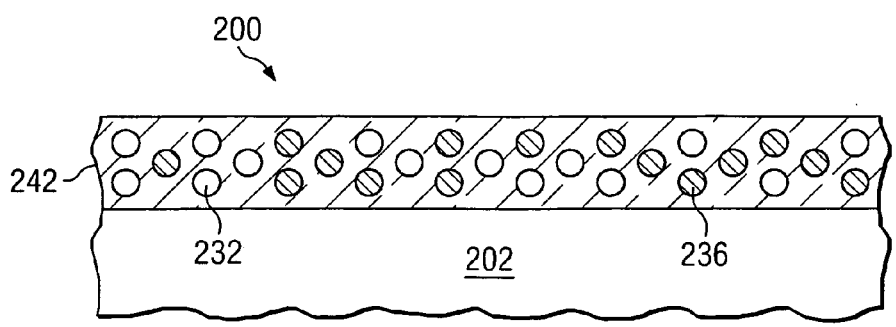
Figure 14:
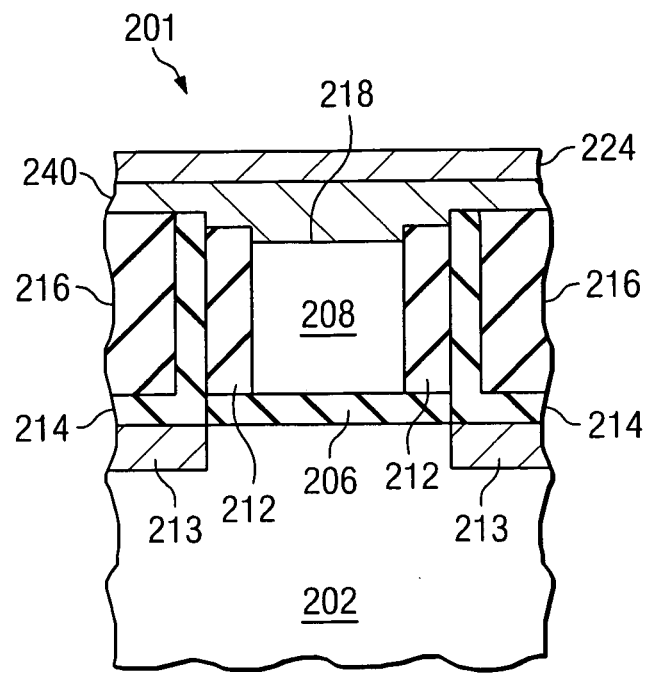
FIGS. 14 and 15 show cross-sectional views of an embodiment of the present invention implemented in the fabrication of a gate of a transistor.

FIGS. 8 through 10 show cross-sectional views of a method of forming silicide in accordance with a preferred embodiment of the present invention. A workpiece 202 is provided, the workpiece 202 comprising a semiconductive material 208 disposed at a top surface thereof. In one embodiment, the semiconductive material 208 may comprise a layer of semiconductive material 208 such as polysilicon, other form of silicon, or other semiconductor materials formed over a top surface of the workpiece 202, as shown in FIG. 8. In another embodiment, the semiconductive material 208 may comprise an exposed gate of a transistor, as shown in FIG. 14, with other material layers 212, 214 and 216 disposed around the semiconductive material 208, for example.

The semiconductive material 208 comprises a plurality of third atoms 232, as shown. Note that the first atoms 236, the second atoms 234, and the third atoms 232 are referred to herein as "first," "second," and "third" not according to the order of introduction in this discussion, but rather, according to the order of introduction in the claims section that follows.

The semiconductive material 208 preferably comprises a first thickness $t_1$, as shown. The first thickness $t_1$ preferably comprises about 1000 to 1500 Angstroms in one embodiment. In another embodiment, the first thickness $t_1$ preferably comprises about 2000 Angstroms or less, for example. Alternatively, the first thickness $t_1$ may comprise other dimensions, for example.

A first material layer 240 is disposed over at least the semiconductive material 208, as shown in FIG. 8. The first material layer 240 preferably comprises an alloy that includes a first metal and a second metal. The first material layer 240 is preferably deposited using a sputter process, a physical vapor deposition (PVD) process, or a chemical vapor deposition (CVD) process, as examples, although alternatively, other deposition processes may also be used to form the first material layer 240.

The first metal of the first material layer 240 comprises a plurality of first atoms 236 and the second metal of the first material layer 240 comprises a plurality of second atoms 234, as shown. The first material layer 240 preferably comprises a second thickness $t_2$, wherein the second thickness $t_2$ is greater than or equal to the first thickness $t_1$. The second thickness $t_2$ preferably comprises about 1000 to 2000 Angstroms in one embodiment. In another embodiment, the second thickness $t_2$ preferably comprises about 2000 Angstroms or less. Alternatively, the second thickness $t_2$ may comprise other dimensions, for example.

The first metal of the first material layer 240 preferably comprises Co or Ni, in one embodiment, as examples, although alternatively, the first metal may comprise other materials. The first metal comprises a dominant diffusion species that will readily migrate or diffuse toward and bond with the atoms 232 of the semiconductive material 208 when heated, for example.

The second metal preferably comprises Ti in one embodiment. However, the second metal may comprise Ti, W, Pt, Hf, Zr, Ta, or combinations thereof, as examples, although alternatively, the second metal may comprise other materials. The second metal preferably comprises a heavy metal that is a non-dominant diffusion species. For example, the second metal preferably comprises a material that will not readily migrate or diffuse toward and bond with the atoms 232 of the semiconductive material 208 when heated, for example. Rather, the second metal preferably comprises a material wherein the second atoms 234 of the second metal preferably attract the third atoms 232 of the semiconductive material 208 when heated, for example.

Next, a second material layer 224 is formed over the first material layer 240, the second material layer 224 comprising an oxide-formation preventing material. The second material layer 224 is preferably substantially thinner than the first material layer 240 and the semiconductive material 208, e.g., is preferably thinner than the first thickness $t_1$, as shown. For example, the second material layer 224 preferably comprises a thickness of about 150 Angstroms or less, and in one embodiment, more preferably comprises a thickness of about 100 Angstroms or less. The second material layer 224 preferably comprises TiN in one embodiment, for example, although alternatively, the second material layer 224 may comprise other materials that prevent the first material layer 240 from oxidizing during the manufacturing process, for example, such as TaN or SiN, as examples. The second material layer 224 is preferably deposited using a sputter process, a PVD process, or a CVD process, as examples, although alternatively, other deposition processes may also be used to form the second material layer 224.

Next, the workpiece 202, e.g., and all layers disposed on the workpiece 202, including the semiconductive material 208, the first material layer 240 and the second material layer 224, are heated. Preferably, the workpiece 202 is heated to a temperature of about 300 to 750 degrees C. for about 30 minutes or less, as examples, although alternatively, the workpiece 202 may be heated to other temperatures for other time periods. The lower the temperature, the longer the heating process preferably is, and the higher the temperature, the shorter the heating process preferably is, as examples.

Advantageously, because of the novel first material layer 240 comprising an alloy of the first metal and the second metal, and because of the preferred thicknesses of the material layers 208, 240 and 224, heating the workpiece 202 causes a portion of the third atoms 232 of the semiconductive material 208 to move towards and bond to the second atoms 234 of the second metal of the first material layer 240, leaving vacancies in the semiconductive material 208. The vacancies attract first atoms 236 of the first metal of the first material layer 240. Thus, heating the workpiece 202 also causes a portion of the first atoms 236 of the first metal of the first material layer 240 to move into the vacancies in the semiconductive material 208. Other portions of the first atoms 236 of the first metal of the first material layer 240 migrate into the semiconductive material 208 and form bonds with the third atoms 232 of the semiconductive material 208, for example.

Because the stoichiometry of the materials selected (e.g., the semiconductive material 208, the first metal and the second metal) is strong, and because of the thicknesses of the materials used, advantageously, the semiconductive material 208 becomes fully silicided throughout its entire thickness to form a fully silicided material layer 242, as shown in FIG. 9. The vacancies in the semiconductive material 208 are beneficial because they make it easier for the first atoms 236 of the first metal of the first material layer 240 (FIG. 8) to move into the semiconductive material 208. The resulting first material layer 240' (FIG. 9) comprises at least a portion of the third atoms 232 and the second atoms 234 of the second metal.

In one embodiment, a portion of the first atoms 236 of the first metal may also remain in the first material layer 240' after heating. In another embodiment, all of the first atoms 236 may have migrated or diffused into the semiconductive material 208 to form the fully silicided material 242. The fully silicided material 242 may comprise Ni-silicide or Co-silicide, for example, if the first metal comprises Ni or Co, respectively.

After the heating step to fully silicide the semiconductive material 208, preferably, the first material layer 240 and the second material layer 224 are removed from over the semiconductive material in a strip process, as shown in FIG. 10. For example, the first material layer 240 and the second material layer 224 may be stripped using a chemical containing $NH_4OH$, $H_2O_2$, and $H_2O$, although alternatively, other chemistries may be used. Another heating step may be performed to reduce the resistance of the fully silicided material 242, for example.

Figure 15:
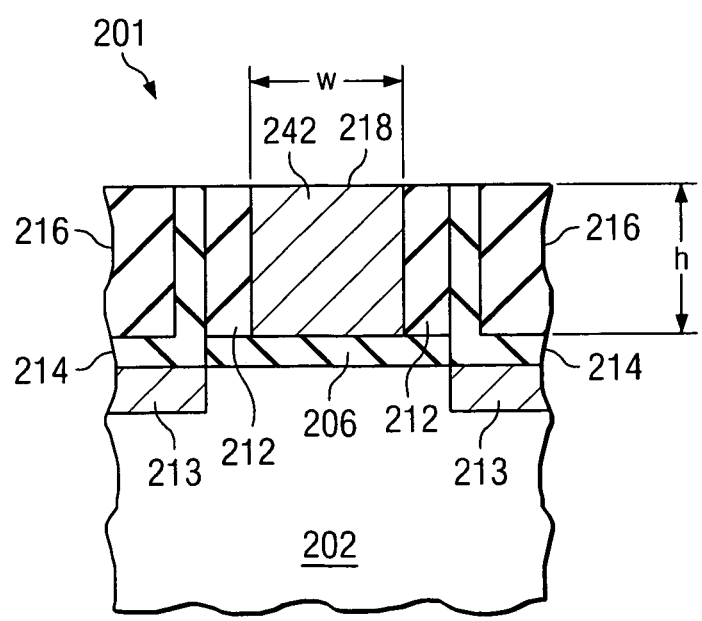

The semiconductive material 208 may comprise many different structures or devices or parts of structures or devices. As an example, the semiconductive material 208 may comprise a gate of a transistor, as shown in FIGS. 14 and 15, to be described further herein.

Figure 11:
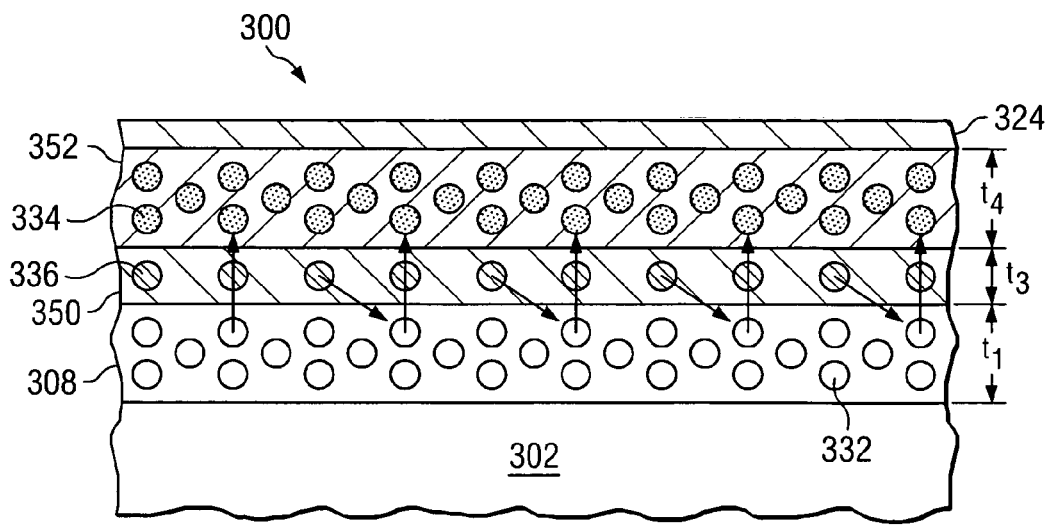
FIGS. 11 through 13 show cross-sectional views of another method of forming silicide in accordance with another preferred embodiment of the present invention.
Figure 12:
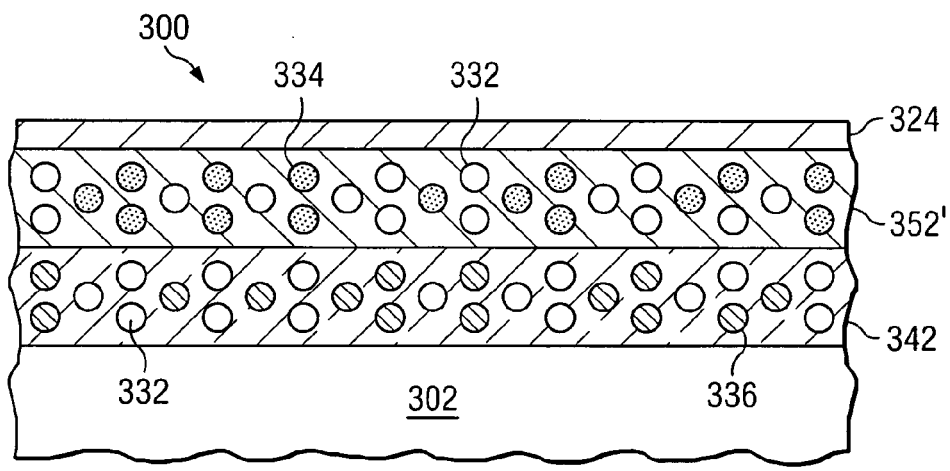
Figure 13:
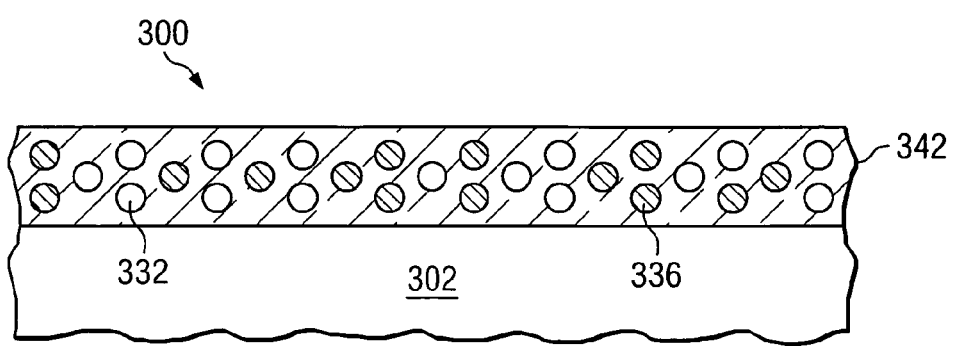

FIGS. 11 through 13 show cross-sectional views of a method of forming silicide in accordance with another preferred embodiment of the present invention. In this embodiment, rather than using an alloy of the first metal and the second metal as described in the first embodiment, the first metal is deposited as a first metal layer 350 over the semiconductive material 308. The first metal layer 350 is preferably thin enough for the third atoms 332 of the semiconductive material 308 to diffuse through and bond to the second atoms 334 of the second metal layer 352 that is disposed over the first metal layer 350, as shown in FIG. 11. The first metal layer 350 is preferably also thick enough to fully silicide the semiconductive material 308, for example.

In this embodiment, the semiconductive material 308 comprises a first thickness $t_1$, and the first metal layer comprises a third thickness $t_3$ (the third thickness $t_3$ is referred to in the claims as a second thickness). The first thickness $t_1$ preferably comprises about 2000 Angstroms or less, and in one embodiment comprises about 1000 to 2000 Angstroms, for example, although alternatively, the first thickness $t_1$ may comprise other dimensions. The third thickness $t_3$ is preferably less than the first thickness $t_1$, in this embodiment. The first metal layer 350 preferably comprises Co, Ni, or other diffusion dominant species, for example, and may be deposited by sputtering, PVD, CVD or other deposition techniques. The first metal layer 350 preferably comprises a thickness $t_3$ of about 600 Angstroms, e.g., if the semiconductive material 308 comprises a thickness $t_1$ of about 1200 Angstroms. The third thickness $t_3$ preferably comprises about 500 to 1000 Angstroms, for example. In general, preferably the first metal layer 350 comprises a third thickness $t_3$ of about half the thickness ($\frac{1}{2} t_1$) of the semiconductive material 308, in one embodiment. In another embodiment, the first metal layer 350 preferably comprises a thickness $t_3$ of about ¼ to ¾ of the first thickness $t_1$, for example.

Next, a second metal layer 352 comprising a second metal is deposited over the first metal layer 350, the second metal layer 352 comprising a plurality of second atoms 334. The second metal layer 352 preferably comprises a non-diffusion dominant material such as a heavy metal, wherein the third atoms 332 of the semiconductive material 308 have a tendency to migrate or diffuse towards and bond with the second atoms 334 of the second metal layer 352, for example. The second metal layer 352 preferably comprises Ti, W, Pt, Hf. Zr, Ta, or combinations thereof, as examples, although alternatively, the second metal may comprise other materials. The second metal layer 352 may be deposited by sputtering, PVD, CVD or other deposition techniques, as examples. The second metal layer 352 preferably comprises a fourth thickness $t_4$ (referred to in the claims as a third thickness), wherein the fourth thickness $t_4$ is preferably between about 1000 to 2000 Angstroms thick, as examples, although the fourth thickness $t_4$ may alternatively comprise other dimensions.

An oxide-formation preventing material 324 is formed over the second metal layer, comprising similar materials and thicknesses as described for the first embodiment shown in FIGS. 8 through 10. The workpiece 302 is then heated, e.g., at the temperatures and for the time period previously described for the first embodiment, causing a portion of the third atoms 332 of the semiconductive material 308 to move through the first metal layer 350 and towards the second atoms 334 of the second metal layer 352, bonding with the second atoms 334 of the second metal layer 352 and leaving vacancies in the semiconductive material 308, and causing at least a portion of the first atoms 336 of the first metal layer 350 to move into the vacancies in the semiconductive material 308.

In this embodiment, again, because of the novel material and material thickness selection described herein, heating the workpiece 302 causes the semiconductive material 308 to form a fully silicided material 342, as shown in FIG. 12. A portion of (not shown in the Figure), or all of the first metal layer 350 (see FIG. 12), may be consumed during the heating process, due to diffusion of the Ni or Co into the semiconductive material 308. The second metal layer 352' after the heating process includes a portion of the third atoms 332 that have diffused into the second metal layer 352', as shown. The second metal layer 352' and the oxide-formation preventing layer 324 may be removed, leaving the structure 300 shown in FIG. 13. Optionally, the semiconductor device 300 may be heated again to reduce the resistance of the fully silicided material 342, for example.

FIGS. 14 and 15 show cross-sectional views of an embodiment of the present invention implemented in the fabrication of a fully silicided gate 242 (see FIG. 15) of a transistor 201. After the manufacturing process step shown in FIG. 3, thin insulating layer 214 is removed from over the semiconductive material 208, and the cap layer 110 (see FIG. 3) is removed from over the semiconductive material 208 to expose a top surface of the semiconductive material 208. Next, a first material layer 240 and second material layer 224 as described with reference to the embodiment shown in FIGS. 8 through 10 are deposited over the exposed portion of the semiconductive material 208, as shown in FIG. 14. The workpiece 202 is heated to fully silicide the semiconductive material 208 and form a fully silicided gate 242, as shown in FIG. 5. The embodiment shown in FIGS. 11 through 13 may also be used to form a fully silicided gate (not shown), for example.

Embodiments of the invention include semiconductor devices 200 and 300 and structures manufactured using the methods described herein, for example. Embodiments of the present invention described herein are particularly beneficial in structures having a high aspect ratio, e.g., having a height h to width w (h:w) ratio (see FIG. 15) of about 1.5:1 or greater, because it can be difficult to fully silicide high aspect ratio features.

Advantages of embodiments of the invention include novel methods of forming fully silicided material layers of semiconductor devices. Semiconductor devices having more uniform operating characteristics and more predictable manufacturing results may be achieve using the novel methods described herein. The resistance of conductive features, such as gates, is reduced. In transistor applications, forming fully silicided gates in accordance with embodiments of the present invention results in reduced poly depletion and Fermi-pinning effects. The materials, material thicknesses, and temperatures are selected to achieve a differential diffusion rate of Si (atoms 222/322) and the siliciding metal (Co or Ni) (atoms 236/336), resulting in a directional material exchange that fully silicides a Si layer 242/342.

Although embodiments of the present invention and their advantages have been described in detail, it should be understood that various changes, substitutions and alterations can be made herein without departing from the spirit and scope of the invention as defined by the appended claims. For example, it will be readily understood by those skilled in the art that many of the features, functions, processes, and materials described herein may be varied while remaining within the scope of the present invention. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of manufacturing a semiconductor device, the method comprising:

depositing a first material layer over a semiconductive material, the semiconductive material disposed at a top surface of a workpiece, the first material layer comprising an alloy of a first metal and a second metal, wherein the first metal comprises a plurality of first atoms, the second metal comprises a plurality of second atoms, and the semiconductive material comprises a plurality of third atoms;

depositing a second material layer over the first material layer, the second material layer comprising an oxide-formation preventing material;

converting all of the semiconductive material into a third material layer, the third material layer comprising at least a portion of the plurality of first atoms and at least a portion of the plurality of third atoms; and after converting all of the semiconductive material, removing the second material layer and the first material layer from over the third material layer.

2. The method according to claim 1, wherein the first metal comprises a dominant diffusion species.

3. The method according to claim 2, wherein the first metal comprises Co or Ni, and wherein the semiconductive material comprises silicon.

4. The method according to claim 1, wherein converting all of the semiconductive material into the third material layer comprises heating the workpiece, causing a portion of the plurality of third atoms of the semiconductive material to move towards and bond to the plurality of second atoms of the second metal, leaving vacancies in the semiconductive material, and causing a portion of the plurality of first atoms of the first metal to move into the vacancies in the semiconductive material.

5. The method according to claim 4, wherein heating the workpiece causes the semiconductive material to form a fully silicided material.

6. The method according to claim 4, wherein heating the workpiece comprises heating the workpiece to a temperature of about 300 to 750 degrees C. for about 30 minutes or less.

7. The method according to claim 4, wherein providing the workpiece comprises:

depositing a gate dielectric material over the workpiece;

depositing a gate material over the gate dielectric material, the gate material comprising the semiconductive material;

patterning the gate material and the gate dielectric material, forming a gate and a gate dielectric;

forming source and drain regions in the workpiece proximate the gate and the gate dielectric;

depositing an insulating layer over the source and drain regions and the gate and the gate dielectric; and removing the insulating layer, exposing a top surface of the gate.

8. The method according to claim 7, wherein the first metal comprises Co or Ni, wherein the semiconductive material of the gate material comprises silicon, and wherein heating the workpiece causes the semiconductive material to form a fully silicided material.

9. The method according to claim 7, wherein the semiconductive material of the gate material comprises a first thickness, wherein depositing the first material layer comprises depositing a material comprising a second thickness, wherein the second thickness is greater than or equal to the first thickness, and wherein depositing the second material layer comprises depositing a material having a third thickness, the third thickness being less than the first thickness.

10. The method according to claim 7, wherein the first thickness comprises about 2000 Angstroms or less, wherein the second thickness comprises about 2000 Angstroms or less, and wherein the third thickness comprises about 150 Angstroms or less.

11. The method according to claim 7, wherein the second metal comprises Ti, W, Pt, Hf, Zr, Ta or combinations thereof.

12. The method according to claim 7, wherein heating the workpiece comprises heating the workpiece to a temperature of about 300 to 750 degrees C. for about 30 minutes or less.

13. A transistor manufactured in accordance with the method of claim 7.

14. The method according to claim 7, further comprising removing the first material layer and the second material layer from over the third material layer.

15. The method according to claim 1, wherein the semiconductive material comprises a first thickness, wherein depositing the first material layer comprises depositing a material comprising a second thickness, wherein the second thickness is greater than or equal to the first thickness.

16. The method according to claim 15, wherein the first thickness comprises about 2000 Angstroms or less, and wherein the second thickness comprises about 2000 Angstroms or less.

17. The method according to claim 15, wherein depositing the second material layer comprises depositing a material having a third thickness, the third thickness being less than the first thickness.

18. The method according to claim 17, wherein the third thickness comprises about 150 Angstroms or less, and wherein the second material layer comprises TiN, TaN, or SiN.

19. The method according to claim 1, wherein the second metal comprises Ti, W, Pt, Hf, Zr, Ta, or combinations thereof.

20. The method according to claim 1, wherein the workpiece comprises a transistor formed thereon, wherein the semiconductive material comprises a gate of the transistor.

21. The semiconductor device manufactured by the method according to claim 1.

22. A method of manufacturing a semiconductor device, the method comprising:

providing a workpiece, the workpiece comprising a semiconductive material disposed at a top surface thereof, the semiconductive material comprising a first thickness;

depositing a first metal layer over the semiconductive material, the first metal layer comprising a plurality of first atoms and a second thickness, the second thickness being less than the first thickness;

depositing a second metal layer over the first metal layer, the second metal layer comprising a plurality of second atoms, wherein the semiconductive material comprises a plurality of third atoms;

depositing an oxide-formation preventing material over the second metal layer;

converting all of the semiconductive material into a third metal layer and converting at least a portion of the second metal layer into a fourth metal layer, wherein the third metal layer comprises at least a portion of the plurality of first atoms and at least a portion of the plurality of third atoms, and wherein the fourth metal layer comprises at least a portion of the plurality of second atoms and at least a portion of the plurality of third atoms;

after converting all of the semiconductive material, removing the oxide-formation preventing material from over the fourth metal layer; and after removing the oxide-formation preventing material, removing the first, second and fourth metal layers.

23. The method according to claim 22, wherein converting all of the semiconductive material into the third metal layer comprises heating the workpiece, causing a portion of the plurality of third atoms of the semiconductive material to move through the first metal layer and towards the plurality of second atoms of the second metal layer, bonding with the plurality of second atoms of the second metal layer and leaving vacancies in the semiconductive material, and causing a portion of the plurality of first atoms of the first metal layer to move into the vacancies in the semiconductive material.

24. The method according to claim 23, wherein heating the workpiece comprises heating the workpiece to a temperature of about 300 to 750 degrees C. for about 30 minutes or less.

25. The method according to claim 24, wherein depositing the first metal layer comprises depositing Co or Ni, wherein the semiconductive material comprises silicon, and wherein heating the workpiece causes the semiconductive material to form a fully silicided material.

26. The method according to claim 22, wherein depositing the second metal layer comprises depositing Ti, W, Pt, Hf, Zr, Ta or combinations thereof.

27. The method according to claim 22, wherein depositing the first metal layer comprises depositing a layer having the second thickness comprising about ¼ to ¾ of the first thickness.

28. The method according to claim 27, wherein the first thickness comprises about 2000 Angstroms or less, and wherein the second thickness comprises about 500 to 1000 Angstroms.

29. The method according to claim 22, wherein the second thickness of the first metal layer is thin enough so that the plurality of third atoms from the semiconductive material may move through the first metal layer and bond with the plurality of second atoms in the second metal layer.

30. The method according to claim 22, wherein depositing the first metal layer comprises depositing a layer comprising the second thickness of about half the thickness of the semiconductive material, wherein depositing the second metal layer comprises depositing a layer comprising a third thickness of between about 1000 to 2000 Angstroms, and wherein depositing the oxide-formation preventing material comprises depositing TiN, TaN, or SiN comprising a fourth thickness of about 150 Angstroms or less.

31. The semiconductor device manufactured in accordance with the method of claim 22.

32. A method of manufacturing a semiconductor device, the method comprising:

providing a workpiece, the workpiece comprising a semiconductive material disposed at a top surface thereof;

depositing a first material layer over the semiconductive material, the first material layer comprising an alloy of a first metal and a second metal, wherein the first metal comprises a plurality of first atoms, the second metal comprises a plurality of second atoms, and the semiconductive material comprises a plurality of third atoms;

depositing a second material layer over the first material layer, the second material layer comprising an oxide-formation preventing material; and heating the workpiece, causing a portion of the plurality of third atoms of the semiconductive material to move towards and bond to the plurality of second atoms of the second metal, leaving vacancies in the semiconductive material, and causing all of the plurality of first atoms of the first metal to move into the vacancies in the semiconductive material.

33. A method of manufacturing a semiconductor device, the method comprising:

providing a workpiece, the workpiece comprising a semiconductive material disposed at a top surface thereof, the semiconductive material comprising a first thickness;

depositing a first metal layer over the semiconductive material, the first metal layer comprising a plurality of first atoms and a second thickness, the second thickness being less than the first thickness;

depositing a second metal layer over the first metal layer, the second metal layer comprising a plurality of second atoms, wherein the semiconductive material comprises a plurality of third atoms;

depositing an oxide-formation preventing material over the second metal layer; and heating the workpiece, causing a portion of the plurality of third atoms of the semiconductive material to move through the first metal layer and towards the plurality of second atoms of the second metal layer, bonding with the plurality of second atoms of the second metal layer and leaving vacancies in the semiconductive material, and causing all of the plurality of first atoms in the first metal layer to diffuse into the vacancies in the semiconductive material.

\* \* \* \* \*